(12) United States Patent
Yanase et al.

(10) Patent No.: US 9,428,417 B2
(45) Date of Patent: Aug. 30, 2016

(54) COMPOSITE SUBSTRATE

(75) Inventors: Tomoki Yanase, Shiga (JP); Atsushi Mushiake, Shiga (JP); Takashi Murata, Shiga (JP); Shinkichi Miwa, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 14/131,770

(22) PCT Filed: Jul. 12, 2012

(86) PCT No.: PCT/JP2012/067790
§ 371 (c)(1),
(2), (4) Date: Jan. 9, 2014

(87) PCT Pub. No.: WO2013/008876
PCT Pub. Date: Jan. 17, 2013

(65) Prior Publication Data
US 2014/0154467 A1  Jun. 5, 2014

(30) Foreign Application Priority Data
Jul. 13, 2011  (JP) ................................. 2011-154399

(51) Int. Cl.
| | | |
|---|---|---|
| *D06N 7/04* | (2006.01) |
| *B32B 7/02* | (2006.01) |
| *C03C 17/32* | (2006.01) |
| *C03C 3/095* | (2006.01) |
| *C03C 3/093* | (2006.01) |
| *B32B 17/06* | (2006.01) |
| *B32B 17/10* | (2006.01) |
| *G02B 1/04* | (2006.01) |
| *H01L 51/00* | (2006.01) |
| *H01L 51/52* | (2006.01) |

(52) U.S. Cl.
CPC ............. *C03C 17/32* (2013.01); *B32B 17/064* (2013.01); *B32B 17/10018* (2013.01); *B32B 17/10706* (2013.01); *B32B 17/10788* (2013.01); *C03C 3/093* (2013.01); *C03C 3/095* (2013.01); *G02B 1/04* (2013.01); *B32B 2367/00* (2013.01); *H01L 51/0096* (2013.01); *H01L 51/5275* (2013.01); *Y10T 428/24355* (2015.01); *Y10T 428/24942* (2015.01)

(58) Field of Classification Search
None
See application file for complete search history.

(56) References Cited

U.S. PATENT DOCUMENTS

| | | | |
|---|---|---|---|
| 5,593,786 A | 1/1997 | Parker et al. | |
| 5,635,278 A * | 6/1997 | Williams | ............... B29D 11/00 |
| | | | 428/141 |
| 2005/0243252 A1 | 11/2005 | Matsuoka | |
| 2009/0178756 A1 | 7/2009 | Matsuoka | |
| 2009/0233782 A1 | 9/2009 | Sasai | |
| 2010/0165468 A1 * | 7/2010 | Yamada et al. | ............... 359/613 |
| 2012/0073654 A1 | 3/2012 | Ketola et al. | |
| 2012/0114904 A1 | 5/2012 | Yanase et al. | |
| 2012/0196103 A1 | 8/2012 | Murashige et al. | |

FOREIGN PATENT DOCUMENTS

| | | |
|---|---|---|
| JP | 59-50048 | 3/1984 |
| JP | 2010-221441 | 10/2010 |
| JP | 2011-88789 | 5/2011 |
| JP | 2011-102228 | 5/2011 |
| TW | 200538773 | 12/2005 |
| WO | 2010/141697 | 12/2010 |
| WO | 2011/004844 | 1/2011 |

OTHER PUBLICATIONS

Extended European Search Report issued Feb. 18, 2015 in corresponding European Patent Application No. 12811555.7.
International Preliminary Report on Patentability and Written Opinion of the International Searching Authority issued Jan. 23, 2014 in International (PCT) Application No. PCT/JP2012/067790.
International Search Report issued Oct. 23, 2012 in International (PCT) Application No. PCT/JP2012/067790.
Taiwanese Office Action dated Mar. 1, 2016 issued in corresponding Taiwanese Patent Application No. 101125124 with partial English translation.

* cited by examiner

*Primary Examiner* — David Sample
*Assistant Examiner* — Nicole T Gugliotta
(74) *Attorney, Agent, or Firm* — Wenderoth, Lind & Ponack, L.L.P.

(57) ABSTRACT

Provided is a composite substrate, including a glass sheet and a resin sheet bonded to each other, in which the glass sheet has a refractive index nd of 1.55 or more and 2.3 or less and the resin sheet has a refractive index nd of 1.55 or more and 2.3 or less.

19 Claims, No Drawings

COMPOSITE SUBSTRATE

TECHNICAL FIELD

The present invention relates to a composite substrate comprising a high-refractive-index glass sheet and a high-refractive-index resin sheet bonded to each other, and more specifically, to a composite substrate suitable for, for example, an OLED device, in particular, an OLED lighting device.

BACKGROUND ART

In recent years, attention has been increasingly paid to a display and a lighting device that use an OLED light-emitting element. Each of the OLED devices has a structure in which an organic light-emitting element is sandwiched by substrates on which a transparent conductive film such as an ITO film is formed. When an electric current flows through the organic light-emitting element in this structure, a hole and an electron in the organic light-emitting element are combined to emit light. The emitted light enters a substrate via the transparent conductive film such as an ITO film and is released out while repeating reflection in the substrate.

SUMMARY OF INVENTION

Technical Problem

Meanwhile, the organic light-emitting element has a refractive index nd of 1.9 to 2.1, and ITO has a refractive index nd of 1.9 to 2.0. On the other hand, the substrate generally has a refractive index nd of about 1.5. Thus, a conventional OLED device involves a problem in that a difference in refractive index between the substrate and the ITO film at their interface leads to a high reflectance, and hence light emitted from the organic light-emitting element cannot be extracted efficiently.

Meanwhile, when a high-refractive-index glass substrate is used to extract light emitted from the organic light-emitting element, the reflectance of the light at the interface between the substrate and air increases, resulting in the occurrence of a problem in that the light cannot be extracted efficiently.

Thus, a technical object of the present invention is to provide a substrate having high light extraction efficiency.

Solution to Problem

The inventors of the present invention have made extensive studies, and have consequently found that the above-mentioned technical object can be achieved by restricting the refractive index of each of a glass sheet and a resin sheet within a predetermined range and then bonding the sheets to each other. Thus, the finding is proposed as the present invention. That is, a composite substrate according to the present invention is a composite substrate, comprising a glass sheet and a resin sheet bonded to each other, wherein the glass sheet has a refractive index nd of 1.55 or more and 2.3 or less and the resin sheet has a refractive index nd of 1.55 or more and 2.3 or less. Herein, the purposes of bonding the resin sheet to the glass sheet are to suppress light emitted in an organic layer from reflecting, owing to differences in refractive index among the organic layer, the glass sheet, and the resin sheet, between the layers to improve efficiency, and to prevent the scattering of glass shards produced when the glass sheet is broken.

With this, the reflectance of light at the interface between the substrate and an ITO film can be reduced, and the reflectance of light at the interface between the substrate and air can also be reduced. Further, a non-reflective structure can be easily formed in a surface of the resin sheet. When the surface is positioned on the side in contact with air of an OLED lighting device or the like, light emitted in the organic light-emitting layer is difficult to return into the organic light-emitting layer. As a result, light extraction efficiency can be enhanced.

Herein, the "refractive index nd of the glass sheet" can be measured with a refractometer, and can be measured, for example, by producing samples having a rectangular parallelepiped shape of 25 mm by 25 mm by about 3 mm, then subjecting the samples to annealing treatment at a cooling rate of 0.1° C./min in the temperature range from (Ta+30° C.) to (strain point−50° C.), and subsequently measuring the refractive index with a refractometer KPR-2000 manufactured by Shimadzu Corporation in a state in which an immersion liquid having a refractive index matching to those of the samples is immersed between glass and prism. Further, "the refractive index nd of the resin sheet" can be measured with a refractometer, and can be measured with, for example, an ellipsometer.

Second, in the composite substrate of the present invention, the glass sheet preferably comprises, as a glass composition in terms of mol %, 10 to 70% of $SiO_2$, 0 to 10% of $B_2O_3$, 0.1 to 60% of $SrO+BaO+La_2O_3+Nb_2O_5$, 0 to 35% of $La_2O_3$, and 0 to 15% of $Li_2O+Na_2O+K_2O$, has a molar ratio $(MgO+CaO+SrO+BaO)/(La_2O_3+Nb_2O_5+BaO+TiO_2+ZrO_2)$ of 0.1 to 4, has a strain point of 600° C. or more, and has a refractive index nd of 1.55 to 2.3. Herein, the term "$SrO+BaO+La_2O_3+Nb_2O_5$" refers to the total content of SrO, BaO, $La_2O_3$, and $Nb_2O_5$. The term "$Li_2O+Na_2O+K_2O$" refers to the total content of $Li_2O$, $Na_2O$, and $K_2O$. The term "MgO+CaO+SrO+BaO" refers to the total content of MgO, CaO, SrO, and BaO. The term "$La_2O_3+Nb_2O_5+BaO+TiO_2+ZrO_2$" refers to the total content of $La_2O_3$, $Nb_2O_5$, BaO, $TiO_2$, and $ZrO_2$. The term "strain point" refers to a value measured on the basis of the method described in ASTM C336-71.

Third, in the composite substrate of the present invention, the glass sheet is preferably formed of glass having a liquidus temperature of 1,250° C. or less. Herein, the term "liquidus temperature" refers to a value obtained by measuring a temperature at which crystals of glass deposit after glass powder that has passed through a standard 30-mesh sieve (500 μm) and remained on a 50-mesh sieve (300 μm) is placed in a platinum boat and kept in a gradient heating furnace for 24 hours.

Fourth, in the composite substrate of the present invention, the glass sheet is preferably formed of glass having a liquidus viscosity of $10^{3.5}$ dPa·s or more. Herein, the term "liquidus viscosity" refers to a value obtained by measuring the viscosity of glass at its liquidus temperature by a platinum sphere pull up method.

Fifth, in the composite substrate of the present invention, the glass sheet is preferably formed by an overflow down-draw method. Herein, the term "overflow down-draw method" refers to a method comprising causing molten glass to overflow from both sides of a heat-resistant, trough-shaped structure, and subjecting the overflowing molten glass to down-draw downward while joining the flows of the overflowing molten glass at the lower end of the trough-shaped structure, to thereby form the molten glass into a glass sheet.

Sixth, in the composite substrate of the present invention, the glass sheet preferably has at least one surface (in particular, an effective surface) having a surface roughness Ra of 10 nm or less. In the case of an OLED lighting device, an ITO film is generally formed on one surface of the glass sheet. When the surface on which the ITO film is formed has a low smoothness, luminance unevenness is liable to occur in the OLED lighting device. Thus, when the surface roughness Ra of at least one surface (in particular, an effective surface) of the glass sheet is controlled to 10 nm or less and an ITO film is formed on the surface, such a failure can be easily prevented. Herein, the term "surface roughness Ra" refers to a value measured by a method in accordance with JIS B0601: 2001.

Seventh, in the composite substrate of the present invention, the glass sheet preferably has a thickness of 2.0 mm or less.

Eighth, in the composite substrate of the present invention, the glass sheet is preferably formed of glass having a density of 4.0 g/cm$^3$ or less.

Ninth, in the composite substrate of the present invention, a size of the glass sheet is preferably 100 mm or more in width and 100 mm or more in length.

Tenth, in the composite substrate of the present invention, the resin sheet is preferably formed of any one kind of polyvinyl chloride, polyvinylidene chloride, polystyrene, a styrene-acrylonitrile copolymer, polyester, polyamide, polyimide, polyurethane, an epoxy resin, a polycarbonate, and an acrylic resin.

Eleventh, in the composite substrate of the present invention, the resin sheet preferably has at least one surface in which an uneven structure is formed. With this, the uneven structure in the surface of the resin sheet can suppress the reflection of light from the surface of the substrate, and hence light extraction efficiency can be enhanced. Herein, it may be possible to form an uneven structure in a surface of a glass sheet by sandblasting or the like, but this method involves drawbacks in that: the strength of the glass sheet deteriorates; and it is difficult to form an ideal uneven structure. Thus, as described above, it is preferred to form an uneven structure in a surface of a resin sheet.

Twelfth, in the composite substrate of the present invention, the resin sheet preferably has at least one surface (in particular, an effective surface) having a surface roughness Ra of 0.5 nm or more.

Thirteenth, in the composite substrate of the present invention, the resin sheet preferably has a thickness of 0.01 to 3 mm.

Fourteenth, the composite substrate of the present invention preferably further comprises an adhesive layer between the glass sheet and the resin sheet, wherein the adhesive layer has a thickness of 100 μm or less.

Fifteenth, the composite substrate of the present invention preferably has a value of (the refractive index nd of the resin sheet)–(the refractive index nd of the glass sheet) of 0.001 to 0.1.

Sixteenth, the composite substrate of the present invention preferably has a haze value of 5% or more. Herein, the "haze value" is a value measured on the basis of JIS K7361-1 (1997) and can be measured with, for example, a commercially available haze meter.

Seventeenth, the composite substrate of the present invention is preferably used in a lighting device.

Eighteenth, the composite substrate of the present invention is preferably used in an OLED lighting device.

Nineteenth, the composite substrate of the present invention is preferably used in an OLED display.

Advantageous Effect of Invention

According to one embodiment of the present invention, the refractive index of each of the glass sheet and the resin sheet in the composite substrate is controlled properly, and hence reflection of light adversely affecting light extraction can be suppressed and light extraction efficiency can be improved.

DESCRIPTION OF EMBODIMENTS

A composite substrate according to one embodiment of the present invention is produced by bonding a resin sheet to one surface of a glass sheet, and is used in, for example, an OLED display or an OLED lighting device. Hereinafter, the glass sheet and resin sheet in the composite substrate according to this embodiment are described in detail. Note that a composite resin sheet in which a resin sheet is bonded to one surface of a glass sheet is described in the following embodiment, but a composite resin sheet in which a resin sheet is bonded to each of both surfaces of a glass sheet may be used as a composite resin sheet of the present invention.

The glass sheet in the composite substrate according to this embodiment has a refractive index nd of 1.55 or more, preferably 1.58 or more, 1.60 or more, 1.63 or more, particularly preferably 1.64 or more. When the refractive index nd of the glass sheet is less than 1.55, light cannot be extracted efficiently because of the reflection at the interface between an ITO film and the glass. On the other hand, when the refractive index nd of the glass sheet is too high, the reflectance at the interface between the glass sheet and the resin sheet becomes higher, and hence light extraction efficiency is liable to lower. Thus, the refractive index nd of the glass sheet is 2.30 or less, 2.00 or less, 1.90 or less, 1.85 or less, 1.80 or less, 1.75 or less, particularly preferably 1.70 or less.

The glass sheet desirably has the glass composition, glass properties, and the like as shown below. Note that, in the description of the content range of each component, the expression "%" refers to "mol %" unless otherwise stated.

The content of $SiO_2$ is preferably 10 to 70%. When the content of $SiO_2$ decreases, it is difficult to form a glass network structure, resulting in difficulty in vitrification. Further, the viscosity of the glass excessively lowers and hence it is difficult to ensure a high liquidus viscosity. Thus, the content of $SiO_2$ is preferably 15% or more, 20% or more, 30% or more, 40% or more, 45% or more, 50% or more, particularly preferably 55% or more. On the other hand, when the content of $SiO_2$ increases, the meltability and formability are liable to lower, and the refractive index nd is liable to lower. Thus, the content of $SiO_2$ is preferably 68% or less, 65% or less, particularly preferably 63% or less.

The content of $Al_2O_3$ is preferably 0 to 20%. When the content of $Al_2O_3$ increases, devitrified crystals are liable to deposit in glass, the liquidus viscosity is liable to lower. Further, the refractive index nd is liable to lower. Thus, the content of $Al_2O_3$ is preferably 15% or less, 10% or less, 8% or less, particularly preferably 6% or less. Note that, when the content of $Al_2O_3$ decreases, the glass composition loses a balance among the components, with the result that the glass is liable to denitrify to the worse. Thus, the content of $Al_2O_3$ is preferably 0.1% or more, 0.5% or more, particularly preferably 1% or more.

When the content of $B_2O_3$ increases, the refractive index nd and the Young's modulus are liable to lower and the strain point is also liable to lower. Thus, the content of $B_2O_3$ is preferably 10% or less, 8% or less, particularly preferably 6% or less. On the other hand, when the content of $B_2O_3$ decreases, the denitrification resistance is liable to deteriorate. Thus, the content of $B_2O_3$ is preferably 0.1% or more, particularly preferably 1% or more.

$SrO+BaO+La_2O_3+Nb_2O_5$ is a component that increases the refractive index nd without deteriorating the devitrification resistance. However, when $SrO+BaO+La_2O_3+Nb_2O_5$ is added in a large amount, the glass composition loses a balance among the components, with the result that the devitrification resistance is liable to deteriorate to the worse and the density and the thermal expansion coefficient may excessively increase. The lower limit range of $SrO+BaO+La_2O_3+Nb_2O_5$ is suitably 0.1% or more, 5% or more, 10% or more, 15% or more, particularly suitably 18% or more. Further, the upper limit range of $SrO+BaO+La_2O_3+Nb_2O_5$ is suitably 60% or less, 50% or less, 40% or less, 35% or less, 25% or less, particularly suitably 22% or less.

The content of SrO is preferably 0 to 20%. When the content of SrO increases, the refractive index nd, density, and thermal expansion coefficient tend to increase. When the content of SrO excessively increases, the glass composition loses a balance among the components, with the result that the devitrification resistance is liable to lower. Thus, the content of SrO is preferably 18% or less, 14% or less, 12% or less, 11% or less, 8% or less, 7% or less, particularly preferably 6% or less. Note that, when the content of SrO decreases, the meltability is liable to lower and the refractive index nd is liable to lower. Thus, the content of SrO is 0.1% or more, 0.8% or more, 1.4% or more, 3% or more, particularly preferably 4% or more.

The content of BaO is preferably 0 to 60%. Among alkaline-earth metal oxides, BaO is a component that increases the refractive index nd without reducing the viscosity extremely. When the content of BaO increases, the refractive index nd, density, and thermal expansion coefficient tend to increase. However, when the content of BaO excessively increases, the glass composition loses a balance among the components, with the result that the devitrification resistance is liable to lower. Thus, the content of BaO is preferably 50% or less, 45% or less, 40% or less, 35% or less, 34% or less, 32% or less, particularly preferably 30% or less. Note that, when the content of BaO decreases, it is difficult to obtain a desired refractive index nd and it is difficult to ensure a high liquidus viscosity. Thus, the content of BaO is preferably 0.1% or more, 1% or more, 2% or more, 5% or more, 10% or more, particularly preferably 13% or more.

$La_2O_3$ is a component that increases the refractive index nd. When the content of $La_2O_3$ increases, the density and thermal expansion coefficient excessively increase, and the devitrification resistance is liable to lower. Thus, the upper limit range of $La_2O_3$ is suitably 35% or less, 25% or less, 15% or less, 10% or less, 8% or less, 5% or less, particularly preferably 3% or less. Note that, when $La_2O_3$ is added, the addition amount is preferably 0.1% or more, 0.3% or more, 0.5% or more, 0.8% or more, particularly preferably 1% or more.

$Nb_2O_5$ is a component that increases the refractive index nd. When the content of $Nb_2O_5$ increases, the density and thermal expansion coefficient excessively increase, and the devitrification resistance is liable to lower. Thus, the content of $Nb_2O_5$ is preferably 0 to 10%, 0 to 7%, 0 to 5%, 0 to 3%, 0 to 1%, 0 to 0.5%, particularly preferably 0 to 0.1%.

The molar ratio (MgO+CaO)/(SrO+BaO) is preferably 0 to 1. When the molar ratio (MgO+CaO)/(SrO+BaO) is too large, the glass composition loses its balance, with the result that the devitrification resistance is liable to deteriorate to the worse. Hence, it is difficult to ensure a high liquidus viscosity and the strain point is liable to lower. On the other hand, when the molar ratio (MgO+CaO)/(SrO+BaO) is too small, the density may excessively increase. Thus, the lower limit range of the molar ratio (MgO+CaO)/(SrO+BaO) is suitably 0.1 or more, 0.2 or more, 0.3 or more, particularly suitably 0.35 or more. Further, the upper limit range of the molar ratio (MgO+CaO)/(SrO+BaO) is suitably 0.8 or less, 0.7 or less, 0.6 or less, particularly suitably 0.5 or less. Herein, the term "MgO+CaO" refers to the total content of MgO and CaO. The term "SrO+BaO" refers to the total content of SrO and BaO.

MgO is a component that increases the refractive index nd, Young's modulus, and strain point and a component that reduces the viscosity at high temperature. However, when MgO is added in a large amount, the liquidus temperature rises, with the result that the devitrification resistance may deteriorate, and the density and thermal expansion coefficient may excessively increase. Thus, the content of MgO is preferably 20% or less, 15% or less, 10% or less, 5% or less, 3% or less, particularly preferably 1% or less.

The content of CaO is preferably 0 to 15%. When the content of CaO increases, the density and thermal expansion coefficient tend to increase. Further, when the content of CaO excessively increases, the glass composition loses its balance, with the result that the denitrification resistance is liable to lower. Thus, the content of CaO is preferably 15% or less, 13% or less, 11% or less, particularly preferably 9.5% or less. Note that, when the content of CaO decreases, the meltability deteriorates, the Young's modulus lowers, and the refractive index nd is liable to lower. Thus, the content of CaO is preferably 0.5% or more, 1% or more, 2% or more, 4% or more, 6% or more, particularly preferably 7% or more.

The molar ratio $(MgO+CaO+SrO+BaO)/(La_2O_3+Nb_2O_5+BaO+TiO_2+ZrO_2)$ is preferably 0.1 to 4. When the molar ratio $(MgO+CaO+SrO+BaO)/(La_2O_3+Nb_2O_5+BaO+TiO_2+ZrO_2)$ is too large, the refractive index nd is liable to lower. However, when the molar ratio $(MgO+CaO+SrO+BaO)/(La_2O_3+Nb_2O_5+BaO+TiO_2+ZrO_2)$ is too small, it may be difficult to obtain a high liquidus viscosity and the density and the thermal expansion coefficient may excessively increase. Thus, the lower limit range of the molar ratio $(MgO+CaO+SrO+BaO)/(La_2O_3+Nb_2O_5+BaO+TiO_2+ZrO_2)$ is suitably 0.1 or more, 0.3 or more, 0.5 or more, 0.8 or more, 1 or more, 1.3 or more, particularly suitably 1.5 or more. Further, the upper limit range of the molar ratio $(MgO+CaO+SrO+BaO)/(La_2O_3+Nb_2O_5+BaO+TiO_2+ZrO_2)$ is suitably 4 or less, 3.5 or less, 3 or less, 2.8 or less, 2.5 or less, particularly suitably 2.0 or less.

$TiO_2$ is a component that increases the refractive index nd. When the content of $TiO_2$ increases, the devitrification resistance is liable to lower. Thus, the content of $TiO_2$ is preferably 0 to 20%, 0 to 15%, 0 to 8%, 0 to 6%, particularly preferably 0 to 5%.

$ZrO_2$ is a component that increases the refractive index nd. When the content of $ZrO_2$ increases, the devitrification resistance is liable to lower. Thus, the content of $ZrO_2$ is preferably 0 to 20%, 0 to 15%, 0 to 10%, 0 to 8%, 0 to 6%, particularly preferably 0 to 5%.

$Li_2O+Na_2O+K_2O$ is a component that reduces the viscosity and is a component that adjusts the thermal expansion coefficient. However, when $Li_2O+Na_2O+K_2O$ is added in a large amount, the viscosity excessively lowers, with the result that it is difficult to ensure a high liquidus viscosity. Thus, the content of $Li_2O+Na_2O+K_2O$ is preferably 10% or less, 5% or less, 3% or less, 2% or less, 1% or less, 0.5% or less, particularly preferably 0.1% or less. Note that, the content of each of $Li_2O$, $Na_2O$, and $K_2O$ is preferably 8% or less, 5% or less, 2% or less, 1% or less, 0.5% or less, particularly preferably 0.1% or less.

As a fining agent, one kind or two or more kinds selected from the group consisting of $As_2O_3$, $Sb_2O_3$, $CeO_2$, $SnO_2$, F, Cl, and $SO_3$ may be added in an amount of 0 to 3%, in particular, 0.1 to 2%. Note that, it is preferred to use $As_2O_3$, $Sb_2O_3$, and F, in particular, $As_2O_3$ and $Sb_2O_3$ in an amount as small as possible from the environmental viewpoint, and each of the contents thereof is preferably less than 0.1%. From the environmental viewpoint, $SnO_2$, $SO_3$, and Cl are each preferably used as the fining agent. In particular, the content of $SnO_2$ is preferably 0 to 3%, 0 to 1%, 0.01 to 0.5%, particularly preferably 0.05 to 0.4%. Further, the content of $SnO_2+SO_3+Cl$ is preferably 0 to 3%, 0 to 1%, 0.001 to 1%, 0.01 to 0.5%, particularly preferably 0.01 to 0.3%. Herein, the term "$SnO_2+SO_3+Cl$" refers to the total content of $SnO_2$, $SO_3$, and Cl.

PbO is a component that reduces the viscosity at high temperature and increases the refractive index, but is preferably used in an amount as small as possible from the environmental viewpoint. The content of PbO is preferably 0.5% or less, and it is desirable that glass be substantially free of PbO. Herein, the phrase "substantially free of PbO" refers to the case where the content of PbO in the glass composition is less than 1,000 ppm (by mass).

In addition to the above-mentioned components, other components may be added at, for example, up to 15%.

A suitable glass sheet can be produced by combining suitable content ranges of the respective components and glass properties. Of those, particularly suitable combinations of glass composition ranges and glass properties are as described below.

(1) The glass sheet comprises, as a glass composition in terms of mol %, 20 to 70% of $SiO_2$, 0 to 8% of $B_2O_3$, 5 to 50% of $SrO+BaO+La_2O_3+Nb_2O_5$, 0.1 to 30% of $La_2O_3$, and 0 to 5% of $Li_2O+Na_2O+K_2O$, has a molar ratio $(MgO+CaO+SrO+BaO)/(La_2O_3+Nb_2O_5+BaO+TiO_2+ZrO_2)$ of 0.5 to 3.5, and has a refractive index nd of 1.55 to 2.00.

(2) The glass sheet comprises, as a glass composition in terms of mol %, 40 to 70% of $SiO_2$, 0 to 5% of $B_2O_3$, 10 to 40% of $SrO+BaO+La_2O_3+Nb_2O_5$, 0.3 to 15% of $La_2O_3$, and 0 to 3% of $Li_2O+Na_2O+K_2O$, has a molar ratio $(MgO+CaO+SrO+BaO)/(La_2O_3+Nb_2O_5+BaO+TiO_2+ZrO_2)$ of 1 to 3.5, and has a refractive index nd of 1.55 to 1.85.

(3) The glass sheet comprises, as a glass composition in terms of mol %, 50 to 70% of $SiO_2$, 0 to 3% of $B_2O_3$, 15 to 35% of $SrO+BaO+La_2O_3+Nb_2O_5$, 0.5 to 10% of $La_2O_3$, and 0 to 1% of $Li_2O+Na_2O+K_2O$, has a molar ratio $(MgO+CaO+SrO+BaO)/(La_2O_3+Nb_2O_5+BaO+TiO_2+ZrO_2)$ of 1.3 to 3, and has a refractive index nd of 1.55 to 1.80.

(4) The glass sheet comprises, as a glass composition in terms of mol %, 50 to 70% of $SiO_2$, 0 to 1% of $B_2O_3$, 15 to 25% of $SrO+BaO+La_2O_3+Nb_2O_5$, 0.8 to 5% of $La_2O_3$, and 0 to 0.5% of $Li_2O+Na_2O+K_2O$, has a molar ratio $(MgO+CaO+SrO+BaO)/(La_2O_3+Nb_2O_5+BaO+TiO_2+ZrO_2)$ of 1.5 to 2.5, and has a refractive index nd of 1.55 to 1.80.

(5) The glass sheet comprises, as a glass composition in terms of mol %, 50 to 70% of $SiO_2$, 0 to 0.1% of $B_2O_3$, 18 to 22% of $SrO+BaO+La_2O_3+Nb_2O_5$, 1 to 3% of $La_2O_3$, and 0 to 0.1% of $Li_2O+Na_2O+K_2O$, has a molar ratio $(MgO+CaO+SrO+BaO)/(La_2O_3+Nb_2O_5+BaO+TiO_2+ZrO_2)$ of 1.5 to 2.5, and has a refractive index nd of 1.60 to 1.70.

(6) The glass sheet comprises, as a glass composition in terms of mol %, 50 to 70% of $SiO_2$, 0 to 8% of $B_2O_3$, 5 to 15% of MgO, 18 to 22% of $SrO+BaO+La_2O_3+Nb_2O_5$, 0 to 3% of $La_2O_3$, and 0 to 0.1% of $Li_2O+Na_2O+K_2O$, has a molar ratio $(MgO+CaO+SrO+BaO)/(La_2O_3+Nb_2O_5+BaO+TiO_2+ZrO_2)$ of 1.5 to 2.0, and has a refractive index nd of 1.62 to 1.68.

The glass sheet has a density of preferably 4.0 g/cm$^3$ or less, 3.7 g/cm$^3$ or less, 3.5 g/cm$^3$ or less, particularly preferably 3.4 g/cm$^3$ or less. With this, the weight of a device can be reduced.

The glass sheet has a thermal expansion coefficient at 30 to 380° C. of preferably $45\times10^{-7}$ to $110\times10^{-7}/°$ C., $50\times10^{-7}$ to $100\times10^{-7}/°$ C., $60\times10^{-7}$ to $95\times10^{-7}/°$ C., $65\times10^{-7}$ to $90\times10^{-7}/°$ C., $65\times10^{-7}$ to $85\times10^{-7}/°$ C., particularly preferably $70\times10^{-7}$ to $80\times10^{-7}/°$ C. When the thermal expansion coefficient is too low, the thermal expansion coefficient does not match each of the thermal expansion coefficients of an OLED thin film and a transparent conductive film, and hence the glass sheet may have warpage. On the other hand, when the thermal expansion coefficient is too high, the glass sheet is liable to break owing to a thermal shock at the time of applying laser sealing to an OLED device by using glass frit. Thus, when the thermal expansion coefficient is controlled in any of the above-mentioned ranges, such situations as described above can be easily prevented.

The glass sheet has a strain point of preferably 630° C. or more, 650° C. or more, 670° C. or more, 690° C. or more, particularly preferably 700° C. or more. When the heat resistance of the glass sheet is low, the glass sheet is liable to break at the time of applying laser sealing to an OLED lighting device or the like by using glass frit.

The glass sheet has a temperature at $10^{2.5}$ dPa·s of preferably 1,450° C. or less, 1,400° C. or less, 1,370° C. or less, 1,330° C. or less, particularly preferably 1,290° C. or less. With this, the meltability improves, and hence the production efficiency of the glass sheet improves.

The glass sheet has a liquidus temperature of preferably 1,250° C. or less, 1,150° C. or less, 1,130° C. or less, 1,110° C. or less, 1,090° C. or less, 1,070° C. or less, 1,050° C. or less, 1,030° C. or less, particularly preferably 1,000° C. or less. Further, the liquidus viscosity is preferably $10^{3.5}$ dPa·s or more, $10^{3.8}$ dPa·s or more, $10^{4.2}$ dPa·s or more, $10^{4.4}$ dPa·s or more, $10^{4.6}$ dPa·s or more, $10^{5.0}$ dPa·s or more, particularly preferably $10^{5.2}$ dPa·s or more. With this, the glass hardly devitrifies at the time of forming, and it becomes easier to form the glass into a glass sheet by an overflow down-draw method.

The glass sheet preferably has a thickness of 2.0 mm or less, 1.5 mm or less, 1.3 mm or less, 1.1 mm or less, 0.8 mm or less, 0.6 mm or less, 0.5 mm or less, 0.3 mm or less, 0.2 mm or less, particularly preferably 0.1 mm or less. As the thickness of the glass sheet becomes smaller, the flexibility of the glass sheet increases, and a lighting device with high design aesthetics can be easily produced. However, when the thickness of the glass sheet becomes extremely small, the glass sheet is liable to break. Thus, the thickness of the glass sheet is preferably 10 μm or more, particularly preferably 30 μm or more.

The glass sheet has a width of preferably 5 mm or more, 10 mm or more, 50 mm or more, 100 mm or more, 300 mm or more, particularly preferably 500 mm or more. The glass sheet has a length of preferably 5 mm or more, 10 mm or more, 50 mm or more, 100 mm or more, 300 mm or more, particularly preferably 500 mm or more. With this, a larger OLED lighting device or the like can be easily manufactured.

The glass sheet preferably has at least one unpolished surface (preferably both unpolished surfaces). The theoretical strength of glass is very high, but glass is often broken by a stress far lower than the theoretical strength. This is because, in some steps after the glass is formed into a glass sheet, such as a polishing step, small defects called Griffith flaw are produced in the surfaces of the glass sheet. Thus, when the surfaces of a glass sheet are not polished, the mechanical strength that the glass intrinsically has is not easily impaired, and hence the glass sheet does not easily break. In addition, when the surfaces of a glass sheet are not polished, the production cost of the glass sheet can be reduced, because the polishing step thereof can be eliminated.

The surface roughness Ra of at least one surface (preferably both surfaces) of the glass sheet is preferably 10 nm or less, 5 nm or less, 1 nm or less, 0.5 nm or less, 0.3 nm or less, particularly preferably 0.2 nm or less. When an ITO film is formed on a surface having a surface roughness Ra of more than 10 nm, the quality of the ITO film degrades, with the result that uniform light emission is hardly provided.

The glass sheet is preferably formed by an overflow down-draw method. With this, an unpolished glass sheet having good surface quality can be produced. This is because when a glass sheet is formed by the overflow down-draw method, the surfaces that should serve as the surfaces of the glass sheet are formed in the state of a free surface without being brought into contact with a trough-shaped refractory. The structure and material of the trough-shaped structure are not particularly limited as long as the desired size and surface precision of the glass sheet can be achieved. Further, a method of applying a force to molten glass for down-drawing the molten glass downward is also not particularly limited. For example, it is possible to adopt a method comprising rotating a heat-resistant roll having a sufficiently large width in the state of being in contact with molten glass, to thereby draw the molten glass, or a method comprising bringing a plurality of pairs of heat-resistant rolls into contact with only the vicinity of the edge surfaces of molten glass, to thereby draw the molten glass.

A method other than the overflow down-draw method, such as a down-draw method (such as a slot down method or a re-draw method), a float method, or a roll-out method may also be adopted.

Note that the glass sheet is produced, for example, in the following manner. That is, first, a glass batch is manufactured by blending glass materials so that a desired glass composition is achieved. Next, the glass batch is melted, fined, and then formed into a desired shape. Subsequently, the resultant is processed into a desired shape.

The resin sheet in the composite substrate according to this embodiment has a refractive index nd of 1.55 or more, preferably 1.58 or more, 1.60 or more, 1.63 or more, particularly preferably 1.64 or more. When the refractive index nd of the resin sheet is less than 1.55, it is difficult to enhance the light extraction efficiency of an OLED lighting device. On the other hand, when the refractive index nd of the resin sheet is too high, the transmittance of the resin sheet becomes lower and it is difficult to form the resin sheet into the sheet shape. Thus, the refractive index nd of the resin sheet is preferably 2.3 or less, 2.0 or less, 1.9 or less, 1.8 or less, 1.75 or less, particularly preferably 1.7 or less.

From the viewpoint of production cost, a material for the resin sheet is preferably any one of polyethylene terephthalate, polyvinyl chloride, polyvinylidene chloride, polystyrene, a styrene-acrylonitrile copolymer, polyester, polyamide, polyimide, polyurethane, an epoxy resin, polycarbonate, and an acrylic resin.

The resin sheet has a thickness of preferably 2.0 mm or less, 1.5 mm or less, 1.3 mm or less, 1.1 mm or less, 0.8 mm or less, 0.6 mm or less, 0.5 mm or less, 0.3 mm or less, 0.2 mm or less, particularly preferably 0.1 mm or less. As the thickness of the resin sheet becomes smaller, the flexibility of the resin sheet increases, and a lighting device with high design aesthetics can be easily produced. However, when the thickness of the resin sheet becomes extremely small, the resin sheet is liable to break. Thus, the thickness of the resin sheet is preferably 10 µm or more, particularly preferably 30 µm or more.

The resin sheet has at least one surface having a surface roughness Ra of preferably 10 nm or less, 5 nm or less, 1 nm or less, 0.5 nm or less, 0.3 nm or less, particularly preferably 0.2 nm or less. When the surface roughness Ra is more than 10 nm, it is difficult to control the thickness of a transparent conductive film formed on a glass substrate and the thickness of an organic layer. Further, when the resin sheet is bonded to a glass sheet, air bubbles are taken into the interface between the resin sheet and the glass sheet, with the result that the quality of the outer appearance of the resultant composite substrate may deteriorate.

It is preferred that the resin sheet have at least one surface in which an uneven structure is formed, in particular, quadrangular pyramids are formed, for the purpose of enhancing light extraction efficiency. The pitch, depth, shape, and the like of the uneven structure are recommended to be determined while the refractive index nd of a glass sheet, the thickness of an organic material, the refractive index nd of a resin sheet, and the like are taken into consideration.

In the composite substrate according to this embodiment, the value of (the refractive index nd of the resin sheet)−(the refractive index nd of the glass sheet) is preferably 0.001 to 0.1, 0.001 to 0.05, 0.001 to 0.03, 0.001 to 0.01, 0.001 to 0.0008, particularly preferably 0.001 to 0.0005. When the value of (the refractive index nd of the resin sheet)−(the refractive index nd of the glass sheet) is less than 0.001, the reflectance of light increases at the interface between the glass sheet and the resin sheet, and hence light extraction efficiency is liable to deteriorate. On the other hand, the value of (the refractive index nd of the resin sheet)−(the refractive index nd of the glass sheet) is too large, light reflection loss increases larger at the interface between the resin sheet and air, and hence light extraction efficiency is liable to deteriorate.

In the composite substrate according to this embodiment, an adhesive material may be used to bond the glass sheet and the resin sheet to each other. An ethylene-vinyl acetate (EVA) copolymer resin, a UV curable resin, a thermosetting resin, an optical clear adhesive tape (OCA tape), or the like is preferably used as the adhesive material.

The thickness of the adhesive layer is preferably 100 µm or less, 80 µm or less, 50 µm or less, 30 µm or less, 10 µm or less, 8 µm or less, 5 µm or less, particularly preferably 3 µm or less. With this, the thickness of the composite substrate decreases, and hence the weight and size of a device can be easily reduced.

The composite substrate according to this embodiment has a haze value of preferably 5% or more, 10% or more, 30% or more, 50% or more, 70% or more, 80% or more, 90% or more, 93% or more, particularly preferably 98% or more. With this, the reflectance of light at the interface between the resin sheet and air lowers, and hence light extraction efficiency can be enhanced.

Example 1

Examples of the present invention are described by way of Examples. Note that Examples are merely for illustrative purposes and the present invention is by no means limited to Examples shown below.

Tables 1 to 3 show Examples (Sample Nos. 1 to 14) of the present invention. Note that, in the tables, PET refers to polyethylene terephthalate and PEN refers to polyethylene naphthalate.

TABLE 1

|  |  |  | Example |  |  |  |  |
|---|---|---|---|---|---|---|---|
|  |  |  | No. 1 | No. 2 | No. 3 | No. 4 | No. 5 |
| Glass sheet | Glass composition [mol %] | $SiO_2$ | 60.6 | 59.6 | 59.3 | 59.8 | 59.6 |
|  |  | $Al_2O_3$ | 4.1 | 4.1 | 4.1 | 4.1 | 4.1 |
|  |  | CaO | 8.7 | 8.8 | 10.2 | 8.8 | 8.8 |
|  |  | SrO | 4.7 | 5.6 | 4.7 | 4.8 | 4.8 |
|  |  | BaO | 14.2 | 14.2 | 14.1 | 14.8 | 14.3 |
|  |  | $La_2O_3$ | 1.5 | 1.5 | 1.5 | 1.5 | 1.5 |
|  |  | $TiO_2$ | 4.2 | 4.2 | 4.1 | 4.2 | 4.2 |
|  |  | $ZrO_2$ | 2.0 | 2.0 | 2.0 | 2.0 | 2.7 |
|  | (Mg + Ca + Sr + Ba)/(La + Nb + Ba + Ti + Zr) |  | 1.26 | 1.30 | 1.33 | 1.26 | 1.22 |
|  | Sr + Ba + La + Nb |  | 20.4 | 21.3 | 20.4 | 21.1 | 1.22 |
|  | ρ [g/cm³] |  | 3.42 | 3.44 | 3.43 | 3.44 | 20.6 |
|  | α [×10⁻⁷/° C.] |  | 72 | 73 | 74 | 73 | 3.45 |
|  | Ps [° C.] |  | 705 | 704 | 704 | 704 | 72 |
|  | Ta [° C.] |  | 749 | 748 | 748 | 748 | 709 |
|  | Ts [° C.] |  | 907 | 905 | 904 | 904 | 753 |
|  | $10^4$ dPa · s [° C.] |  | 1,115 | 1,108 | 1,105 | 1,109 | 912 |
|  | $10^3$ dPa · s [° C.] |  | 1,223 | 1,211 | 1,206 | 1,211 | 1,116 |
|  | $10^{2.5}$ dPa · s [° C.] |  | 1,295 | 1,279 | 1,274 | 1,279 | 1,218 |
|  | $10^2$ dPa · s [° C.] |  | 1,386 | 1,368 | 1,362 | 1,365 | 1,286 |
|  | TL [° C.] |  | 1,021 | 1,018 | 1,035 | 1,045 | 1,371 |
|  | $\log_{10}\eta TL$ [dPa · s] |  | 5.3 | 5.3 | 5.0 | 4.9 | 1,018 |
|  | Refractive index nd |  | 1.638 | 1.642 | 1.642 | 1.642 | 1.643 |
|  | Thickness [mm] |  | 0.7 | 0.7 | 0.5 | 0.5 | 0.2 |
| Resin sheet | Material |  | Polystyrene | Polycarbonate | Polystyrene | PET | PEN |
|  | Refractive index nd |  | 1.60 | 1.59 | 1.63 | 1.58 | 1.63 |
|  | Thickness [mm] |  | 1.0 | 0.2 | 0.1 | 0.1 | 0.1 |

TABLE 2

|  |  |  | Example |  |  |  |  |
|---|---|---|---|---|---|---|---|
|  |  |  | No. 6 | No. 7 | No. 8 | No. 9 | No. 10 |
| Glass sheet | Glass composition [mol %] | $SiO_2$ | 59.5 | 60.0 | 59.6 | 61.2 | 61.4 |
|  |  | $Al_2O_3$ | 4.1 | 4.1 | 4.9 | 4.1 | 4.1 |
|  |  | CaO | 8.8 | 8.8 | 8.8 | 7.3 | 7.3 |
|  |  | SrO | 4.7 | 4.8 | 4.7 | 4.8 | 4.8 |
|  |  | BaO | 14.2 | 14.3 | 14.2 | 14.3 | 14.3 |
|  |  | $La_2O_3$ | 1.5 | 1.8 | 1.5 | 1.5 | 1.5 |
|  |  | $TiO_2$ | 5.2 | 4.2 | 4.2 | 4.2 | 3.2 |
|  |  | $ZrO_2$ | 2.0 | 2.0 | 2.0 | 2.7 | 3.4 |
|  | (Mg + Ca + Sr + Ba)/(La + Nb + Ba + Ti + Zr) |  | 1.21 | 1.25 | 1.26 | 1.16 | 1.18 |
|  | Sr + Ba + La + Nb |  | 20.5 | 20.9 | 20.5 | 20.6 | 20.6 |
|  | ρ [g/cm³] |  | 3.45 | 3.46 | 3.42 | 3.43 | 3.43 |
|  | α [×10⁻⁷/° C.] |  | 73 | 74 | 71 | 71 | 70 |
|  | Ps [° C.] |  | 705 | 706 | 708 | 711 | 716 |
|  | Ta [° C.] |  | 748 | 750 | 752 | 756 | 761 |
|  | Ts [° C.] |  | 903 | 908 | 911 | 918 | 927 |
|  | $10^4$ dPa · s [° C.] |  | 1,105 | 1,112 | 1,116 | 1,130 | 1,144 |
|  | $10^3$ dPa · s [° C.] |  | 1,207 | 1,214 | 1,222 | 1,237 | 1,251 |
|  | $10^{2.5}$ dPa · s [° C.] |  | 1,274 | 1,282 | 1,291 | 1,308 | 1,323 |
|  | $10^2$ dPa · s [° C.] |  | 1,360 | 1,370 | 1,382 | 1,396 | 1,413 |
|  | TL [° C.] |  | 1,026 | 1,038 | 1,091 | Not measured | Not measured |
|  | $\log_{10}\eta TL$ [dPa · s] |  | 5.1 | 5.0 | 4.3 | Not measured | Not measured |
|  | Refractive index nd |  | 1.649 | 1.641 | 1.636 | 1.638 | 1.634 |
|  | Refractive index nC |  | 1.638 | 1.637 | 1.632 | Not measured | 1.631 |
|  | Thickness [mm] |  | 0.5 | 1.4 | 1.1 | 0.5 | 1.8 |
| Resin sheet | Material |  | Polyvinyl chloride | PET | PEN | Polycarbonate | Polystyrene |
|  | Refractive index nd |  | 1.55 | 1.58 | 1.63 | 1.59 | 1.60 |
|  | Thickness [mm] |  | 0.2 | 0.025 | 0.05 | 0.3 | 0.1 |

TABLE 3

| | | | Example | | | |
|---|---|---|---|---|---|---|
| | | | No. 11 | No. 12 | No. 13 | No. 14 |
| Glass sheet | Glass composition [mol %] | $SiO_2$ | 53.6 | 52.7 | 50.9 | 51.8 |
| | | $Al_2O_3$ | 3.9 | 3.9 | 3.7 | 3.8 |
| | | $B_2O_3$ | 5.8 | 5.7 | 5.5 | 5.6 |
| | | MgO | 0.0 | 5.9 | 11.4 | 11.6 |
| | | CaO | 8.5 | 4.1 | 4.0 | 0.0 |
| | | SrO | 8.5 | 8.3 | 5.8 | 8.1 |
| | | BaO | 13.8 | 13.5 | 13.1 | 13.3 |
| | | $ZrO_2$ | 2.0 | 1.9 | 1.9 | 1.9 |
| | | $TiO_2$ | 4.0 | 4.0 | 3.8 | 3.9 |
| | (Mg + Ca + Sr + Ba)/ (La + Nb + Ba + Ti + Zr) | | 1.55 | 1.64 | 1.83 | 1.73 |
| | Sr + Ba + La + Nb | | 22.2 | 21.9 | 18.9 | 21.4 |
| | $\rho$ [g/cm$^3$] | | 3.38 | 3.37 | 3.32 | 3.35 |
| | $\alpha$ [$\times 10^{-7}$/° C.] | | 75 | 72 | 71 | 70 |
| | Ps [° C.] | | 650 | 645 | 644 | 645 |
| | Ta [° C.] | | 688 | 684 | 683 | 684 |
| | Ts [° C.] | | 832 | 830 | 829 | 830 |
| | $10^4$ dPa·s [° C.] | | 1,017 | 1,020 | 1,014 | 1,022 |
| | $10^3$ dPa·s [° C.] | | 1,109 | 1,116 | 1,106 | 1,118 |
| | $10^{2.5}$ dPa·s [° C.] | | 1,171 | 1,181 | 1,168 | 1,182 |
| | $10^2$ dPa·s [° C.] | | 1,251 | 1,260 | 1,245 | 1,261 |
| | TL [° C.] | | 969 | 954 | 967 | 973 |
| | $\log_{10} \eta TL$ [dPa·s] | | 4.7 | 5.0 | 4.7 | 4.7 |
| | Refractive index nd | | 1.636 | 1.632 | 1.630 | 1.628 |
| | Refractive index nC | | 0.1 | 0.1 | 0.2 | 0.4 |
| | Thickness [mm] | | 1.55 | 1.64 | 1.83 | 1.73 |
| Resin sheet | Material | | PET | PEN | PET | PEN |
| | Refractive index nd | | 1.628 | 1.631 | 1.598 | 1.674 |
| | Thickness [mm] | | 0.05 | 0.05 | 0.05 | 0.05 |

First, glass materials were blended so that each glass composition described in Tables 1 to 3 was achieved. After that, the resultant glass batch was fed into a glass melting furnace and melted at 1,500 to 1,600° C. for 4 hours. Next, the resultant molten glass was poured on a carbon sheet to be formed into a glass sheet, followed by predetermined annealing treatment. Subsequently, the glass sheet was subjected to polishing treatment so that each thickness described in the tables was achieved. Finally, the resultant glass sheet was evaluated for its various characteristics.

The density $\rho$ is a value measured by a well-known Archimedes method.

The thermal expansion coefficient $\alpha$ is a value obtained by measurement of an average value at 30 to 380° C. with a dilatometer. A cylindrical sample (having end surfaces subjected to R processing) having a size of 5 mm in diameter by 20 mm in length was used as a measurement sample.

The strain point Ps is a value measured based on a method as described in ASTM C336-71. Note that, as the strain point Ps becomes higher, the heat resistance becomes higher.

The softening point Ta and the softening point Ts are values measured based on a method as described in ASTM C338-93.

The temperatures at viscosities at high temperature of $10^{4.0}$ dPa·s, $10^{3.0}$ dPa·s, $10^{2.5}$ dPa·s, and $10^{2.0}$ dPa·s are values measured by a platinum sphere pull up method. Note that, as each of the temperatures becomes lower, the meltability becomes more excellent.

The liquidus temperature TL is a value obtained by measuring a temperature at which crystals of glass deposit when glass powder that has passed through a standard 30-mesh sieve (500 μm) and remained on a 50-mesh sieve (300 μm) is placed in a platinum boat and kept in a gradient heating furnace for 24 hours. Further, the liquidus viscosity $\log_{10} \eta TL$ is a value obtained by measuring the viscosity of glass at its liquidus temperature TL by a platinum sphere pull up method. Note that, as the liquidus viscosity $\log_{10} \eta TL$ becomes higher and the liquidus temperature TL becomes lower, each of the denitrification resistance and the formability becomes more excellent.

The refractive indices nd and nC of each glass sheet are values obtained by first producing samples having a rectangular parallelepiped shape of 25 mm by 25 mm by about 3 mm, then subjecting the samples to annealing treatment at a cooling rate of 0.1° C./min in the temperature range from (Ta+30° C.) to (strain point−50° C.), and subsequently measuring the refractive index with a refractometer KPR-2000 manufactured by Shimadzu Corporation in a state in which an immersion liquid having a refractive index matching to that of the samples is immersed between two glass samples. Further, the refractive indices nd and nC of each resin sheet are values measured with an ellipsometer.

The glass sheets and the resin sheets described in the tables were bonded to each other with an OCA (having a thickness of 175 μm) by using a laminating machine, thus manufacturing composite substrates.

Each of the composite substrates according to Sample Nos. 11 to 14 described in Table 3 was used to measure a haze value by using a double-beam-type haze meter. As a result, Sample No. 11 had a haze value of 88%, Sample No. 12 had a haze value of 95%, Sample No. 13 had a haze value of 82%, and Sample No. 14 had a haze value of 74%.

Example 2

Glass materials were blended so that each of the glass compositions according to Sample Nos. 5 and 11 described in Table 1 was achieved, and then the resultant glass batch was loaded into a continuous kiln and melted at a temperature of 1,450 to 1,600° C. Subsequently, the resultant molten glass was formed into a glass sheet having a thickness of 0.5 mm by an overflow down-draw method. The resultant glass sheet was measured for its surface roughness (Ra) for both surfaces. As a result, a value for the surface roughness was 0.2 nm. Note that the surface roughness (Ra) is a value measured by a method in accordance with JIS B0601: 2001.

Further, the glass sheet and a resin sheet made of PET (having a thickness of 100 μm and having a surface roughness Ra of 5 nm for both surfaces) were bonded to each other with EVA (having a thickness of 25 μm) by using a laminating machine, thus manufacturing a composite substrate.

Example 3

Glass materials were blended so that each of the glass compositions according to Sample Nos. 5 and 11 described in Table 1 was achieved, and then the resultant glass batch was loaded into a continuous kiln and melted at a temperature of 1,450 to 1,600° C. Subsequently, the resultant molten glass was formed into a glass sheet having a thickness of 0.5 mm by an overflow down-draw method. The resultant glass sheet was measured for its surface roughness (Ra) for both surfaces. As a result, a value for the surface roughness was 0.2 nm. Note that the surface roughness (Ra) is a value measured by a method in accordance with JIS B0601: 2001.

Further, a UV curable resin was applied onto the glass sheet, and a resin sheet made of PET (having a thickness of 100 μm and having a surface roughness Ra of 1.0 μm for both surfaces) was laminated thereon, followed by UV irradiation, thus manufacturing a composite substrate.

The invention claimed is:

1. A composite substrate, comprising a glass sheet and a resin sheet bonded to each other,
wherein the glass sheet has a refractive index nd of 1.55 or more and 2.3 or less, and the glass sheet has a molar ratio $(MgO+CaO+SrO+BaO)/(La_2O_3+Nb_2O_5+BaO+TiO_2+ZrO_2)$ of 1.16 to 4,
the resin sheet has a refractive index nd of 1.55 or more and 2.3 or less, and
the composite substrate has a haze value of 30% or more.

2. The composite substrate according to claim 1, wherein the glass sheet comprises, as a glass composition in terms of mol %, 10 to 70% of $SiO_2$, 0 to 10% of $B_2O_3$, 0.1 to 60% of $SrO+BaO+La_2O_3+Nb_2O_5$, 0 to 35% of $La_2O_3$, and 0 to 15% of $Li_2O+Na_2O+K_2O$, has a molar ratio $(MgO+CaO+SrO+BaO)/(La_2O_3+Nb_2O_5+BaO+TiO_2+ZrO_2)$ of 1.16 to 4, has a strain point of 600° C. or more, and has a refractive index nd of 1.55 to 2.3.

3. The composite substrate according to claim 1, wherein the glass sheet is formed of glass having a liquidus temperature of 1,250° C. or less.

4. The composite substrate according to claim 1, wherein the glass sheet is formed of glass having a liquidus viscosity of $10^{3.5}$ dPa·s or more.

5. The composite substrate according to claim 1, wherein the glass sheet is formed by an overflow down-draw method.

6. The composite substrate according to claim 1, wherein the glass sheet has at least one surface having a surface roughness Ra of 10 nm or less.

7. The composite substrate according to claim 1, wherein the glass sheet has a thickness of 0.2 mm or more and 2.0 mm or less.

8. The composite substrate according to claim 1, wherein the glass sheet is formed of glass having a density of 4.0 g/cm³ or less.

9. The composite substrate according to claim 1, wherein a size of the glass sheet is 100 mm or more in width and 100 mm or more in length.

10. The composite substrate according to claim 1, wherein the resin sheet is formed of at least one material selected from the group consisting of polyvinyl chloride, polyvinylidene chloride, polystyrene, a styrene-acrylonitrile copolymer, polyester, polyamide, polyimide, polyurethane, an epoxy resin, polycarbonate, and an acrylic resin.

11. The composite substrate according to claim 1, wherein the resin sheet has at least one surface in which an uneven structure is formed.

12. The composite substrate according to claim 1, wherein the resin sheet has at least one surface having a surface roughness Ra of 0.5 nm or more.

13. The composite substrate according to claim 1, wherein the resin sheet has a thickness of 0.01 to 3 mm.

14. The composite substrate according to claim 1, further comprising an adhesive layer between the glass sheet and the resin sheet, wherein the adhesive layer has a thickness of 100 µm or less.

15. The composite substrate according to claim 1, wherein the composite substrate has a value of (the refractive index nd of the resin sheet)–(the refractive index nd of the glass sheet) of 0.001 to 0.1.

16. The composite substrate according to claim 1, wherein the haze value is 50% or more.

17. The composite substrate according to claim 1, wherein the composite substrate is used in a lighting device.

18. The composite substrate according to claim 1, wherein the composite substrate is used in an OLED lighting device.

19. The composite substrate according to claim 1, wherein the composite substrate is used in an OLED display.

* * * * *